United States Patent
Seo et al.

(10) Patent No.: US 8,669,702 B2
(45) Date of Patent: Mar. 11, 2014

(54) LIGHTING DEVICE

(75) Inventors: Satoshi Seo, Kanagawa (JP); Masaaki Hiroki, Kanagawa (JP); Kaoru Hatano, Kanagawa (JP); Ikuko Kawamata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 158 days.

(21) Appl. No.: 13/288,084

(22) Filed: Nov. 3, 2011

(65) Prior Publication Data

US 2012/0126693 A1 May 24, 2012

(30) Foreign Application Priority Data

Nov. 19, 2010 (JP) ................................ 2010-258991

(51) Int. Cl.
*H05B 33/02* (2006.01)
(52) U.S. Cl.
USPC .......................... 313/506; 313/504; 313/512
(58) Field of Classification Search
None
See application file for complete search history.

(56) References Cited

U.S. PATENT DOCUMENTS

| | | | |
|---|---|---|---|
| 5,013,967 A | 5/1991 | Hirotaka et al. | |
| 7,692,199 B2 | 4/2010 | Arai | |
| 2004/0113549 A1* | 6/2004 | Roberts et al. | 313/512 |
| 2005/0110384 A1 | 5/2005 | Peterson | |
| 2007/0114520 A1 | 5/2007 | Garditz et al. | |
| 2008/0018229 A1* | 1/2008 | Yamazaki | 313/498 |
| 2010/0006882 A1 | 1/2010 | Arai | |

FOREIGN PATENT DOCUMENTS

| | | |
|---|---|---|
| EP | 1 760 800 A2 | 3/2007 |
| JP | 2003-036973 | 2/2003 |
| JP | 2005-332773 | 12/2005 |
| JP | 2006-331854 | 12/2006 |

OTHER PUBLICATIONS

European Search Report (Application No. 11189544.7;EP14287) Dated Mar. 22, 2012.

* cited by examiner

*Primary Examiner* — Ashok Patel
(74) *Attorney, Agent, or Firm* — Nixon Peabody LLP; Jeffrey L. Costellia

(57) ABSTRACT

A highly reliable lighting device is provided at low cost by using a simple structure and a simple process. A lighting device with improved convenience, which has a shape suitable for a purpose and can respond to diversified applications is provided. A light-emitting panel which includes a light-emitting element provided over a flexible substrate and including an electroluminescent (EL) layer (the panel is also referred to as an "EL film") is put in a glass housing. The EL film is flexible and thus can be provided in a variety of forms in accordance with the shape of the glass housing.

10 Claims, 7 Drawing Sheets

LIGHTING DEVICE

BACKGROUND OF THE INVENTION

1. Field of the Invention

One embodiment of the present invention relates to a lighting device including a light-emitting material exhibiting electroluminescence.

2. Description of the Related Art

A lighting device in which a light-emitting element containing an electroluminescent material is used has higher emission efficiency than incandescent lamps or fluorescent lamps, and therefore has attracted attention as a next-generation lighting device. A light-emitting element containing an electroluminescent material can be formed in the form of a thin film with a thickness of 1 µm or less by a method such as an evaporation method or a coating method. A lighting device with a modified mode has been reported (e.g., Patent Document 1).

[Patent Document 1] Japanese Published Patent Application No. 2005-332773

SUMMARY OF THE INVENTION

However, the light-emitting element containing an electroluminescent material easily deteriorates due to contaminants such as moisture entering from the outside. Such deterioration is one of the causes for a decline in the reliability of a lighting device. When a passivation technique (sealing technique) using a large number of protective materials and a complicated structure is employed for the light-emitting element containing an electroluminescent material as the countermeasure, the number of materials to be used and the number of steps are increased, which causes a reduction in yield and an increase in cost.

An object of one embodiment of the present invention is to provide a highly reliable lighting device at low cost by using a simple structure and a simple process.

An object of one embodiment of the present invention is to provide a lighting device with improved convenience, which has a shape suitable for a purpose and can respond to diversified applications.

A light-emitting panel which includes a light-emitting element provided over a flexible substrate and including an electroluminescent (EL) layer (the panel is hereinafter referred to as an "EL film") is put in a glass housing. Contaminants such as moisture, which cause deterioration of the light-emitting element, are blocked by the surrounding glass housing, which allows the EL film that is a light-emitting portion to have longer lifetime; thus, a lighting device with high durability and reliability can be obtained.

The glass housing including the EL film includes a terminal electrode which is electrically connected to the EL film and is provided so as to be exposed to the outside. When the terminal electrode is in contact with a terminal electrode of an external power source, the external power source and the EL film are electrically connected to each other, whereby electric power can be supplied to the lighting device.

The EL film is flexible and thus can be provided in a variety of forms in accordance with the shape of the glass housing. For example, a sheet-like EL film can be rolled and put in a cylindrical glass housing. In addition, an EL film may be provided in contact with a glass housing or may be bonded to a glass housing with a bonding layer. An organic resin, a metal material, or the like can be used for the bonding layer.

In order to increase extraction efficiency of light from an EL film, an organic resin layer with a curved surface may be provided on the outside of a glass housing on the light emission surface side of the EL film.

The glass housing may be formed of a plurality of housings bonded to each other and can be formed by fusion of glass, a bonding method using a bonding layer, or the like. The glass housing needs to have a light-transmitting property. However, the glass housing may have a surface with small unevenness to be in a frosted glass form, so that the glass substrate has a function of scattering (diffusing) light from the EL film. Note that a "light-transmitting property" in this specification means a property of transmitting light in at least part of the visible wavelength range. Thus, the glass housing may be colored like a color filter so that light in part of the visible wavelength range is transmitted.

A plurality of EL films may be put in the glass housing. The plurality of EL films may have different shapes and emit light of different colors. A plurality of EL films which emit light of different colors may be put in the glass housing so that light of a mixed color is emitted. The color of light emitted from a lighting device is adjusted, whereby color rendering properties can be improved.

An organic resin film or a metal film can be used as the flexible substrate used for the EL film. The EL film may have a structure in which a light-emitting element is interposed between a pair of flexible substrates. A roll-to-roll method in which a light-emitting element is formed over a rolled flexible substrate to manufacture an EL film is preferably employed, in which case the EL film can be manufactured more easily.

The glass housing may have reduced pressure or may be filled with a resin or an inert gas such as nitrogen. In addition, a hygroscopic substance which serves as a drying agent may be put in the glass housing.

Since the glass housing surrounds the EL film for an increase in durability, a passivation technique using a large number of protective materials and a complicated structure does not need to be employed for the EL film itself. This allows the lighting device to be manufactured at low cost, with a simple process, and with high productivity. Thus, an inexpensive lighting device with high reliability can be provided.

A lighting device disclosed in this specification includes a light-emitting panel which includes a light-emitting element provided over a flexible substrate and including an EL layer interposed between a first electrode and a second electrode; and a glass housing including the light-emitting panel and provided with a first terminal electrode and a second terminal electrode. In the glass housing, the first electrode and the first terminal electrode are electrically connected to each other, and the second electrode and the second terminal electrode are electrically connected to each other.

A lighting device disclosed in this specification includes a plurality of light-emitting panels each of which includes a light-emitting element provided over a flexible substrate and including an EL layer interposed between a first electrode and a second electrode; and a glass housing including the plurality of light-emitting panels and provided with terminal electrodes. In the glass housing, the plurality of light-emitting panels are electrically connected to their respective terminal electrodes.

The shape of the glass housing may correspond to the shapes of the lighting device and a lighting portion of the lighting device. The glass housing can be a rectangular solid, a prism, a cylinder, or the like.

Further, two or more EL layers may be provided with an intermediate layer therebetween. By stacking a plurality of EL layers which emit light of different colors, the color of emitted light can be adjusted. By stacking a plurality of EL layers which emit light of the same color, power efficiency can be improved.

In the lighting device disclosed in this specification, the EL film that is a light-emitting portion is put in the glass housing which is highly effective in blocking contaminants such as moisture, which cause deterioration; thus, the lighting device has high durability. Therefore, the lighting device can also be favorably used outdoors.

It is not necessary to employ a passivation technique using a large number of protective materials and a complicated structure for the durability of the EL film itself. This allows the lighting device to be manufactured at low cost, with a simple process, and with high productivity. Thus, an inexpensive lighting device with high reliability can be provided.

Further, the EL film put in the glass housing is flexible, and thus can be provided in any form and in any place in the glass housing. Thus, a lighting device with improved convenience, which has a shape suitable for a purpose and can respond to diversified applications, can be provided.

DETAILED DESCRIPTION OF THE INVENTION

Figure 1A:
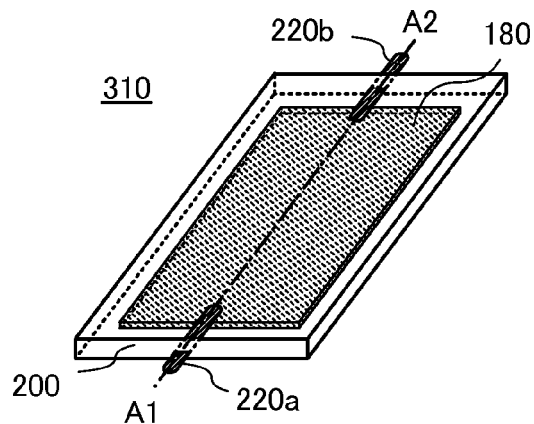
FIGS. 1A to 1D illustrate lighting devices.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description of the embodiments below. In the structures to be given below, the same portions or portions having similar functions are denoted by the same reference numerals in different drawings, and explanation thereof will not be repeated.

Embodiment 1

In this embodiment, embodiments of a lighting device of the present invention will be described with reference to FIGS. 1A to 1D, FIGS. 2A to 2D, FIGS. 3A to 3D, and FIGS. 4A and 4B.

Figure 1B:
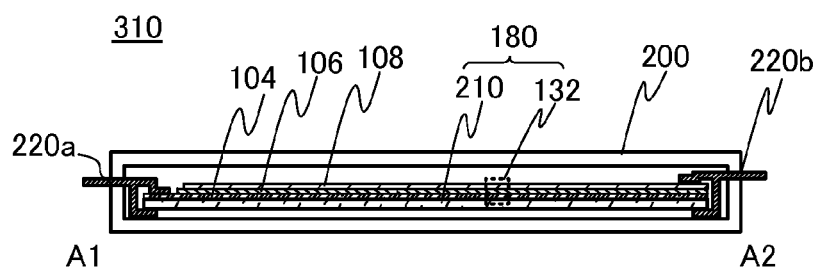
Figure 1C:
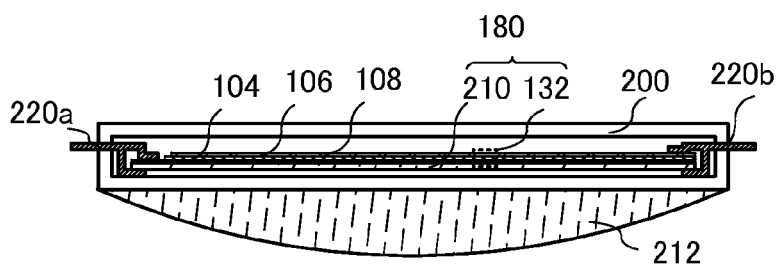
Figure 1D:
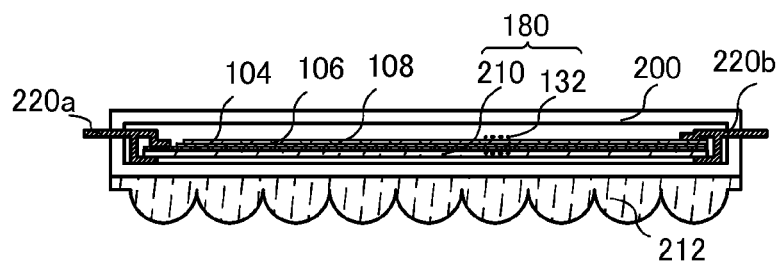

FIG. 1A is a perspective view of a lighting device. FIG. 1B is a cross-sectional view taken along line A1-A2 in FIG. 1A.

As illustrated in FIG. 1A, a lighting device 310 has a structure in which an EL film 180 is put in a glass housing 200, and a terminal electrode 220a and a terminal electrode 220b which are electrically connected to the EL film 180 are provided so as to be exposed to the outside of the glass housing 200.

As illustrated in FIG. 1B, the EL film 180 is a light-emitting panel which includes a light-emitting element 132 provided over a flexible substrate 210 and including an electroluminescent (EL) layer, and the light-emitting element 132 has a structure in which the EL layer is interposed between a pair of electrodes. Note that a plurality of light-emitting elements 132 may be provided in the EL film 180. The light-emitting element 132 has a stacked structure of a first electrode 104, an EL layer 106, and a second electrode 108. Note that although the structure of the EL film 180 and connection portions with the terminal electrodes are not illustrated in detail in FIGS. 2A to 2D, FIGS. 3A to 3D, and FIGS. 4A and 4B, the EL film 180 includes the flexible substrate and the light-emitting element (the first electrode, the EL layer, and the second electrode), and the first electrode and the second electrode are electrically connected to their respective terminal electrodes.

The terminal electrode 220a and the terminal electrode 220b are electrically connected to the first electrode 104 and the second electrode 108 of the light-emitting element 132, respectively.

In the lighting device 310, contaminants such as moisture, which cause deterioration of the light-emitting element 132, are blocked by the surrounding glass housing 200; thus, the lifetime of the EL film 180 that is a light-emitting portion is increased, which results in an increase in the durability and reliability.

A variety kinds of glass such as soda-lime glass, zinc glass, and borosilicate glass can be used for the glass housing 200. In addition, quartz glass can be used. The glass housing 200 needs to have a light-transmitting property. However, the glass housing 200 may have a surface with small unevenness to be in a frosted glass form, so that the glass housing 200 has a function of scattering (diffusing) light from the EL film 180. The glass housing 200 may be colored like a color filter so that light in part of the visible wavelength range is transmitted.

The glass housing 200 may have reduced pressure or may be filled with a resin or an inert gas such as nitrogen. In addition, a hygroscopic substance which serves as a drying agent may be put in the glass housing 200.

As a method of sealing the glass housing 200 after the EL film 180 is provided therein, a sealing method in which portions around an opening of the glass housing are melted and bonded to each other, a sealing method in which an opening is filled with a metal, low-melting-point glass, or a resin to be sealed, or the like can be used. Examples of the sealing method with a metal include a method in which the periphery of an opening is metalized and sealed with a metal (e.g., a lead seal) and a method in which an opening is filled with solder. Further, when a method in which an opening is sealed with an ultraviolet curable resin is employed, heat treatment does not need to be performed.

An organic resin film or a metal film with a thickness of approximately 10 μm or more and 500 μm or less, or the like can be used as the flexible substrate 210. As the organic resin, an aramid resin, a polyethylene naphthalate (PEN) resin, a polyether sulfone (PES) resin, a polyphenylene sulfide (PPS) resin, a polyimide (PI) resin, or the like can be used. Alternatively, a prepreg that is a structure body in which fiber is impregnated with an organic resin may be used. Note that a film of a metal such as stainless steel is preferable due to its low moisture permeability and is provided on the side opposite to a light emission surface, which does not need to have a light-transmitting property. A pair of flexible substrates may be used so that the light-emitting element 132 is interposed therebetween. The flexible substrate 210 may be colored like a color filter so that light in part of the visible wavelength range is transmitted.

A roll-to-roll method in which the light-emitting element 132 is formed over the rolled flexible substrate 210 to manufacture the EL film 180 is preferably employed, in which case the EL film 180 can be manufactured more easily. The light-emitting element 132 can be formed by an evaporation method or a printing method. The light-emitting element 132 may be formed directly on the flexible substrate 210 or may be first formed over another substrate and then transferred to the flexible substrate 210.

When the terminal electrode 220a and the terminal electrode 220b are in contact with the terminal electrodes of an external power source, the external power source and the EL film 180 are electrically connected to each other, whereby electric power can be supplied to the lighting device 310. FIGS. 1A to 1D illustrate an example in which the EL film 180 is held by being interposed between the clip-like terminal electrodes 220a and 220b for electrical connection. When a glass substrate which is thick and easy to break is used in the EL film 180, it is difficult to hold the EL film 180 with the clip-like terminal electrodes 220a and 220b and electrical connection failure easily occurs. In contrast, when the flexible substrate 210 is used in the EL film 180, the EL film 180 is easily held at the time of pressure bonding and electrical connection can be favorably made.

The method and structure of the electrical connection between the EL film 180 and the terminal electrodes 220a and 220b are not particularly limited as long as the electrical connection can be made. For example, a bump may be formed in a connection portion for connection; an anisotropic conductive film may be used; or a conductive film to be used may be formed of a material which can be connected by solder and connection may be made by solder. A resin for fixing may be provided on the periphery of the connection portion.

The EL film 180 is flexible and thus can be provided in a variety of forms in accordance with the shape of the glass housing 200. FIGS. 2A to 2D and FIGS. 3A to 3D each illustrate an example in which the EL film 180 having a curved surface in accordance with the shape of the glass housing 200 is put in the glass housing 200.

Figure 2A:
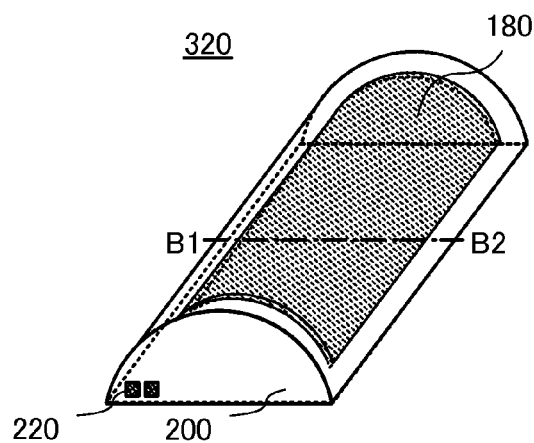
FIGS. 2A to 2D illustrate lighting devices.
Figure 2B:
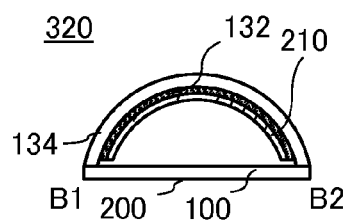

FIG. 2A is a perspective view of a lighting device 320. FIG. 2B is a cross-sectional view taken along line B1-B2 in FIG. 2A. In each of FIGS. 2A and 2B, the lighting device 320 is illustrated as an example in which the glass housing 200 has a curved surface and the EL film 180 is put in the glass housing 200 along the curved surface. Further, as illustrated in FIG. 2B, the glass housing 200 may have a structure in which a plurality of housings (a first glass housing 100 and a second glass housing 134) are bonded; thermal fusion bonding of glass, a bonding method using a bonding layer, or the like can be used.

In the glass housing 200 in FIGS. 2A to 2D, the flat first glass housing 100 and the second glass housing 134 with a curved surface are bonded to each other. The EL film 180 is provided along the curved surface of the second glass housing 134.

Figure 3A:
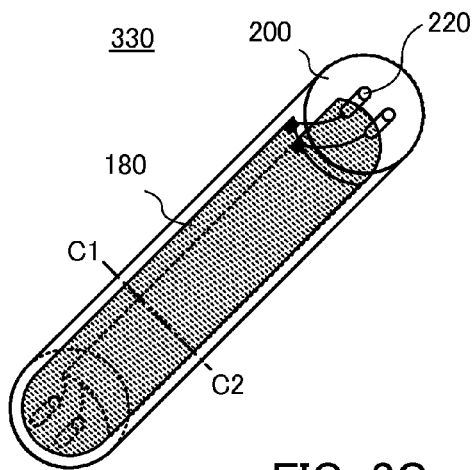
FIGS. 3A to 3D illustrate lighting devices.
Figure 3B:
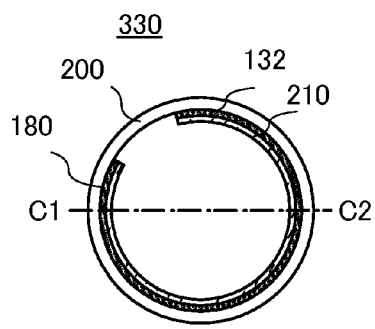

FIG. 3A is a perspective view of a lighting device 330. FIG. 3B is a cross-sectional view taken along line C1-C2 in FIG. 3A. In each of FIGS. 3A and 3B, the lighting device 330 is illustrated as an example in which the sheet-like EL film 180 is rolled to be put in the cylindrical glass housing 200.

Figure 2C:
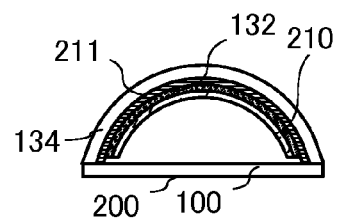
Figure 2D:
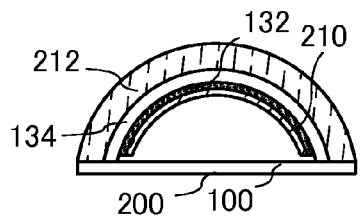

The EL film 180 may be in contact with the glass housing 200 or may be bonded to the glass housing 200 with a bonding layer. FIG. 2B illustrates an example in which the EL film 180 is in contact with the second glass housing 134, and FIG. 2C illustrates an example in which a bonding layer 211 is provided between the second glass housing 134 and the light-emitting element 132 so that the second glass housing 134 and the EL film 180 are bonded to each other. In a similar manner, FIG. 3B illustrates an example in which the EL film 180 is in contact with the glass housing 200, and FIG. 3C illustrates an example in which the bonding layer 211 is provided between the glass housing 200 and the light-emitting element 132 so that the glass housing 200 and the EL film 180 are bonded to each other.

A visible light curable resin, a UV curable resin, a thermosetting resin, or a metal material can be used for the bonding layer 211. Examples of the visible light curable resin, the UV curable resin, and the thermosetting resin include an epoxy resin, an acrylic resin, a silicone resin, a phenol resin, and the like. Such a bonding layer can also be used for bonding the first glass housing 100 and the second glass housing 134.

Figure 3C:
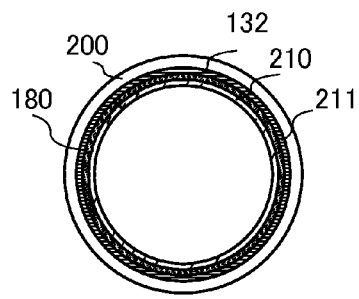
Figure 3D:
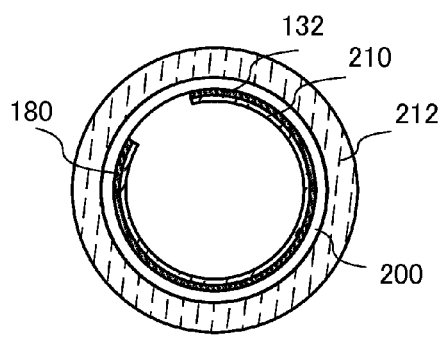

FIGS. 3B and 3C illustrate examples that differ in the size (shape) of the EL film 180. The entire side surface of the cylindrical glass housing 200 can be a light-emitting portion as illustrated in FIG. 3C by adjustment of the size of the EL film 180.

As illustrated in FIGS. 1C and 1D, FIG. 2D, and FIG. 3D, an organic resin layer 212 with a curved surface may be provided on the outside of the glass housing 200 on the light emission surface side of the EL film 180. When the organic resin layer 212 with a curved surface is provided outside the glass housing 200, total reflection of light from the EL film 180 at an interface between the glass housing 200 and the air can be reduced. Thus, the efficiency of extracting light to the outside of the glass housing 200 can be increased. In the case where a light emission surface is flat as in FIG. 1D, the organic resin layer 212 may have a plurality of projections and depressions like a micro lens array. The pitch of the plurality of projections and depressions or the shape of a bottom surface can be variously set; for example, an uneven shape with a vertex, such as a cone or a pyramid (e.g., a triangular pyramid and a square pyramid) may be used.

Figure 4A:
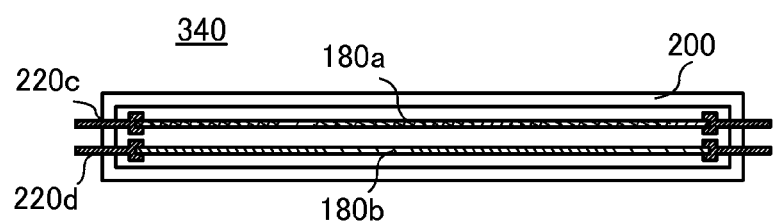
FIGS. 4A and 4B illustrate lighting devices.
Figure 4B:
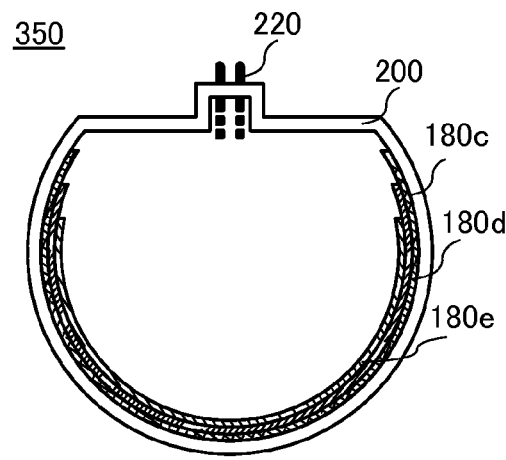

As illustrated in FIGS. 4A and 4B, a plurality of EL films may be put in the glass housing. The plurality of EL films may have the same or different shapes or may emit light of the same or different colors. In FIG. 4A, a lighting device 340 is illustrated as an example in which an EL film 180a and an EL film 180b overlap with each other in the glass housing 200. The EL films 180a and 180b are held by clip-like terminal electrodes 220c and 220d, respectively. Further, as in a lighting device 350 in FIG. 4B, EL films 180c, 180d, and 180e may overlap to be in contact with each other in the glass housing 200. In the case where the EL films are in contact with each other as illustrated in FIG. 4B, the components other than the terminals are preferably covered with an insulating material (e.g., an insulating film) in order to prevent a short circuit between the EL films. For example, the EL films may be interposed between a pair of organic resin films.

An EL film has a light-transmitting property in the case where the EL film needs to transmit light emitted from another EL film. For example, in the case where mixed-color light in which light from the EL film 180a and light from the EL film 180b are mixed is extracted from both the top surface and the bottom surface in FIG. 4A, the EL films 180a and 180b are formed using a light-transmitting material. In the case where light is extracted from only the top surface, part of the EL film 180b, which is on the side opposite to a light emission surface, may be formed using a reflective material. Since light is extracted from a surface other than the top surface in the structure in FIG. 4B, the EL film 180c and the EL film 180d need to have a light-transmitting property. Part of the EL film 180e, which is on the side opposite to a light emission surface, may be formed using a reflective material.

The plurality of EL films put in the glass housing 200 may use the same or different terminal electrodes. In FIG. 4B, a structure of connection between the terminal electrode 220 and the EL films 180c, 180d, and 180e is omitted. Further, the number of terminal electrodes and the structure of the terminal electrode are not limited to those illustrated in the drawing. A plurality of terminal electrodes which are connected to each of the first electrode and the second electrode of the light-emitting element may be provided.

EL films which emit light of different colors are stacked, whereby the color of light emitted from a lighting device can be adjusted. For example, EL films which emit light with different emission wavelength peaks can be used as the EL films which emit light of different colors. White light emission can be obtained by a combination of EL films which emit light of complementary colors such as blue and yellow or blue-green and red. The color rendering properties of a lighting device can be improved by adjustment of the color emitted from the lighting device.

With the use of the lighting device disclosed in this specification, in which an EL film with a desired shape and emission color is freely selected and which is put in the glass housing as described above, an excellent design and function, a simple manufacturing process, and a reduction in cost can be achieved.

In the lighting device of this embodiment, the EL film that is a light-emitting portion is put in the glass housing which is highly effective in blocking contaminants such as moisture, which cause deterioration of the light-emitting element; thus, the lighting device has high durability. Therefore, the lighting device can also be favorably used outdoors.

It is not necessary to employ a passivation technique using a large number of protective materials and a complicated structure for the durability of the EL film itself. This allows the lighting device to be manufactured at low cost, with a simple process, and with high productivity. Thus, an inexpensive lighting device with high reliability can be provided.

Further, the EL film put in the glass housing is flexible, and thus can be provided in any form and in any place in the glass housing. Thus, a lighting device with improved convenience, which has a shape suitable for a purpose and can respond to diversified applications can be provided.

This embodiment can be implemented in appropriate combination with any of the structures described in the other embodiments.

Embodiment 2

In this embodiment, examples of an element structure of a light-emitting element used in a lighting device that is one embodiment of the present invention will be described.

Figure 5A:
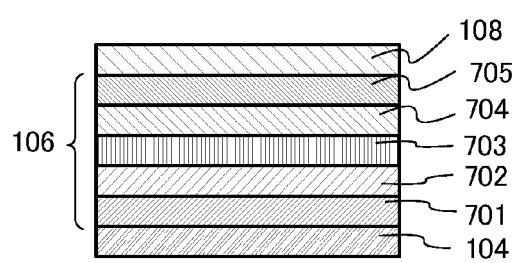
FIGS. 5A to 5C each illustrate an example of a light-emitting element applicable to a lighting device.

A light-emitting element illustrated in FIG. 5A includes a first electrode 104, an EL layer 106 over the first electrode 104, and a second electrode 108 over the EL layer 106.

The EL layer 106 may include at least a light-emitting layer containing a light-emitting organic compound. In addition, the EL layer 106 can have a stacked structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. In this embodiment, a hole-injection layer 701, a hole-transport layer 702, a light-emitting layer 703, an electron-transport layer 704, and an electron-injection layer 705 are stacked in this order over the first electrode 104 in the EL layer 106.

A manufacturing method of the light-emitting element illustrated in FIG. 5A will be described.

First, the first electrode 104 is formed. The first electrode 104 is provided on the side where light is extracted from the EL layer, and thus is formed using a light-transmitting material.

As the light-transmitting material, indium oxide, indium tin oxide (also referred to as ITO), indium zinc oxide (also referred to as IZO), zinc oxide, zinc oxide to which gallium is added, graphane, or the like can be used.

A metal material such as gold, platinum, nickel, tungsten, chromium, molybdenum, iron, cobalt, copper, palladium, or titanium can be used for the first electrode 104. A nitride of the metal material (such as titanium nitride) or the like may be used. Note that in the case of using the metal material (or the nitride thereof), the first electrode 104 may be thinned so as to be able to transmit light.

Next, the EL layer 106 is formed over the first electrode 104. In this embodiment, the EL layer 106 includes the hole-injection layer 701, the hole-transport layer 702, the light-emitting layer 703, the electron-transport layer 704, and the electron-injection layer 705.

The hole-injection layer 701 is a layer that contains a substance having a high hole-injection property. As the substance having a high hole-injection property, for example, metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide can be used. A phthalocyanine-based compound such as phthalocyanine (abbreviation: $H_2Pc$) or copper(II) phthalocyanine (abbreviation: CuPc) can be used.

Any of the following aromatic amine compounds which are low molecular organic compounds can be used: 4,4',4"-tris(N,N-diphenylamino)triphenylamine (abbreviation: TDATA), 4,4',4"-tris [N-(3-methylphenyl)-N-phenylamino] triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Any of high molecular compounds (e.g., oligomers, dendrimers, or polymers) can be used. As examples of the high molecular compounds, the following are given: poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylaminol}phenyl) methacryla mide] (abbreviation: PTPDMA), poly[N,N'-bis (4-butylphenyl)-N,N'-bis(phenyl)benzidine] (abbreviation: Poly-TPD), and the like. A high molecular compound to which acid is added, such as poly(3,4-ethylenedioxythiophene)/poly(styrenesulfonic acid) (PEDOT/PS S) or polyaniline/poly(styrenesulfonic acid) (PAni/PSS), can also be used.

In particular, a composite material in which an acceptor substance is mixed with an organic compound having a high hole-transport property is preferably used for the hole-injection layer 701. With the use of the composite material in which an acceptor substance is mixed with a substance having a high hole-transport property, excellent hole injection from the first electrode 104 can be obtained, which results in a reduction in the driving voltage of the light-emitting element.

Such a composite material can be formed by co-evaporation of a substance having a high hole-transport property and an acceptor substance. The hole-injection layer 701 is formed using the composite material, whereby hole injection from the first electrode 104 to the EL layer 106 is facilitated.

As the organic compound for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole-transport property. Specifically, a substance having a hole mobility of $10^{-6}$ cm$^2$/Vs or higher is preferably used. Note that any other substances may also be used as long as the hole-transport property thereof is higher than the electron-transport property thereof Specific examples of the organic compounds that can be used for the composite material are given below.

Examples of the organic compound that can be used for the composite material include aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole compounds such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl-2,3,5,6-tetraphenylbenzene.

Any of the following aromatic hydrocarbon compounds can also be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis [2-(1-naphthyl)phenyl)-2-tert-butylanthracene, 9,10-bis [2-(1-naphthyl)phenyl]anthracene, 2,3,6,7-tetramethyl-9,10-di(1-naphthyl)anthracene, and the like.

Any of the following aromatic hydrocarbon compounds can also be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Examples of the electron acceptor include organic compounds such as 7,7,8,8-tetracyano-2,3,5,6-tetrafluoroquinodimethane (abbreviation: F$_4$-TCNQ) and chloranil; and transition metal oxides. Other examples include oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is particularly preferable because it is stable in the air, has a low hygroscopic property, and is easily handled.

Note that the composite material may be formed using any of the above-described electron acceptor and any of the above high molecular compound such as PVK, PVTPA, PTPDMA, or Poly-TPD and may be used for the hole-injection layer 701.

The hole-transport layer 702 is a layer that contains a substance having a high hole-transport property. As the substance having a high hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances given here are mainly ones that have a hole mobility of $10^{-6}$ cm$^2$/Vs or higher. Note that any other substances may also be used as long as the hole-transport property thereof is higher than the electron-transport property thereof Note that the layer containing a substance having a high hole-transport property is not limited to a single layer and may be a stack of two or more layers containing any of the above substances.

A carbazole derivative such as CBP, CzPA, or PCzPA or an anthracene derivative such as t-BuDNA, DNA, or DPAnth may also be used for the hole-transport layer 702.

A high molecular compound such as PVK, PVTPA, PTPDMA, or Poly-TPD can also be used for the hole-transport layer 702.

The light-emitting layer 703 is a layer that contains a light-emitting organic compound. As the light-emitting organic compound, for example, a fluorescent compound which emits fluorescence or a phosphorescent compound which emits phosphorescence can be used.

As the fluorescent compound that can be used for the light-emitting layer 703, a material for blue light emission, a material for green light emission, a material for yellow light emission, and a material for red light emission are given. Examples of the material for blue light emission include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA). Examples of the material for green light emission include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA). Examples of the material for yellow light emission include rubrene and 5,12-bis(1,1'-biphenyl-4-yl)-6,11-diphenyltetracene (abbreviation: BPT). Examples of the material for red light emission include N,N,N',N'-tetrakis(4-methylphenyl)tetracene-5,11-diamine (abbreviation: p-mPhTD) and 7,14-diphenyl-N,N,N',N'-tetrakis(4-methylphenyl)acenaphtho[1,2-α]fluoranthene-3,10-d iamine (abbreviation: p-mPhAFD).

As the phosphorescent compound that can be used for the light-emitting layer 703, a material for blue light emission, a material for green light emission, a material for yellow light emission, a material for orange light emission, and a material for red light emission are given. Examples of the material for blue light emission include bis[2-(4',6'-difluorophenyl)pyridinato-N,C$^{2'}$]iridium(III)tetrakis(1-pyrazolyl)borate (abbreviation: FIr6), bis [2-(4',6'-difluorophenyl)pyridinato-N, C$^{2'}$]iridium(III)picolinate (abbreviation: FIrpic), bis{2-[3,5- bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(III)acetylacetonate (abbreviation: FIr(acac)). Examples of the material for green light emission include tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$). Examples of the material for yellow light emission include bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)). Examples of the material for orange light emission include tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)). Examples of the material for red light emission include organometallic complexes such as bis[2-(2'-benzo[4,5-α]thienyl)pyridinato-N,C$^{3'}$)iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), and (2,3,7,8,12,13,17,18-octaethyl-21H,23H-porphyrinplatinum(II) (abbreviation: PtOEP). In addition, rare-earth metal complexes, such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

Note that the light-emitting layer 703 may have a structure in which any of the above light-emitting organic compounds (a guest material) is dispersed in another substance (a host material). As a host material, a variety of kinds of materials can be used, and it is preferable to use a substance which has a higher lowest unoccupied molecular orbital level (LUMO level) than the light-emitting material and has a lower highest occupied molecular orbital level (HOMO level) than the light-emitting material.

Specific examples of the host material include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), and 6,12-dimethoxy-5,11-diphenylchrysene; and aromatic amine compounds such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB.

Plural kinds of materials can be used as the host material. For example, in order to suppress crystallization, a substance, such as rubrene, which suppresses crystallization may be further added. In addition, NPB, Alq, or the like may be further added in order to efficiently transfer energy to the guest material.

When a structure in which a guest material is dispersed in a host material is employed, crystallization of the light-emitting layer 703 can be suppressed. Further, concentration quenching due to high concentration of a guest material can be suppressed.

A high molecular compound can be used for the light-emitting layer 703. Specifically, a material for blue light emission, a material for green light emission, and a material for orange to red light emission are given. Examples of the material for blue light emission include poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), and poly {(9,9-dioctylfluorene-2,7-diyl)-co-[N,N'-di-(p-butylphenyl)-1,4-diaminobenzene]} (abbreviation: TAB-PFH). Examples of the material for green light emission include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), and poly[(9,9-dioctyl-2,7-divinylenfluorenylene)-alt-co-(2-methoxy-5-(2-ethylhexyloxy)-1, 4-phenylene)]. Examples of the material for orange to red light emission include poly [2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, and poly{[2-methoxy-5-(2-ethylhexyloxy)-1,4-bis(1-cyanovinylenephenylene)]-alt-co-[2,5-bis(N,N'-diphenylamino) -1,4-phenylene]}(abbreviation: CN-PPV-DPD).

Note that the light-emitting layer may have a stacked structure of two or more layers. When the light-emitting layer has a stacked structure of two or more layers and the kind of light-emitting substance used for each light-emitting layer is changed, a variety of emission colors can be obtained. In addition, a plurality of light-emitting substances which emit light of different colors are used as the light-emitting substance, whereby light emission having a broad spectrum or white light emission can be obtained. In particular, for a lighting device in which high luminance is needed, a structure in which light-emitting layers are stacked is preferable.

The electron-transport layer 704 is a layer that contains a substance having a high electron-transport property. Examples of the substance having a high electron-transport property include metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), and bis(2-methyl-8-quinolinolato)(4-phenylphenolato)aluminum (abbreviation: BAlq). Other examples include metal complexes having an oxazole-based or thiazole-based ligand, such as bis[2-(2-hydroxyphenyl)benzoxazolato]zinc (abbreviation: Zn(BOX)$_2$) and bis[2-(2-hydroxyphenyl)benzothiazolato]zinc (abbreviation: Zn(BTZ)$_2$). Besides, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances mentioned here are mainly ones that have an electron mobility of $10^{-6}$ cm$^2$/Vs or higher. Further, the electron-transport layer is not limited to a single layer and may be a stack of two or more layers containing any of the above substances.

The electron-injection layer 705 is a layer that contains a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. Any of the above substances for forming the electron-transport layer 704 can also be used.

Note that the hole-injection layer 701, the hole-transport layer 702, the light-emitting layer 703, the electron-transport layer 704, and the electron-injection layer 705 which are described above can each be formed by a method such as an evaporation method (e.g., a vacuum evaporation method), an ink-jet method, or a coating method.

Figure 5B:
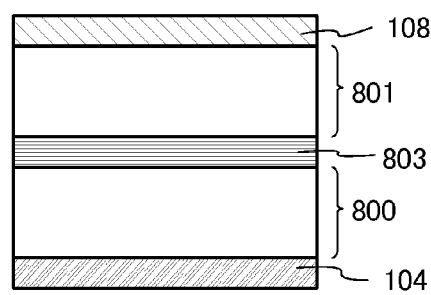

Note that a plurality of EL layers may be stacked between the first electrode 104 and the second electrode 108 as illustrated in FIG. 5B. In that case, a charge generation layer 803 is preferably provided between a first EL layer 800 and a second EL layer 801 which are stacked. The charge generation layer 803 can be formed using the above composite material. Further, the charge generation layer 803 may have a stacked structure including a layer formed using the composite material and a layer formed using another material. In that case, a layer containing an electron donating substance and a substance having a high electron-transport property, a layer formed of a transparent conductive film, or the like can be used as the layer containing another material. As for a light-emitting element having such a structure, problems such as energy transfer and quenching hardly occur, and a light-emitting element which has both high emission efficiency and long lifetime can be easily obtained due to expansion in the choice of materials. Moreover, a light-emitting element which provides phosphorescence from one EL layer and fluorescence from another EL layer can be easily obtained. This structure can be combined with any of the above structures of the EL layer.

The charge generation layer 803 is provided between the stacked EL layers as illustrated in FIG. 5B, whereby the element can have high luminance and long lifetime while the current density is kept low. In addition, a voltage drop due to resistance of the electrode material can be reduced, whereby uniform light emission in a large area is possible.

In the case where an EL layer is a stacked-type element in which two layers are stacked, white light can be extracted to the outside by allowing the first EL layer and the second EL layer to emit light of complementary colors. Note that white light emission can also be obtained with a structure in which each of the first EL layer and the second EL layer includes a plurality of light-emitting layers emitting light of complementary colors. Examples of complementary colors include blue and yellow, and blue-green and red. A substance which emits light of blue, yellow, blue-green, or red light may be selected as appropriate from, for example, the light-emitting substances given above.

An example of a light-emitting element having a structure in which a plurality of EL layers are stacked is described below. First, an example of the structure in which each of the first EL layer and the second EL layer includes a plurality of light-emitting layers emitting light of complementary colors is described.

For example, the first EL layer includes a first light-emitting layer that emits light having an emission spectrum with a peak in the blue to blue-green wavelength range, and a second light-emitting layer that emits light having an emission spectrum with a peak in the yellow to orange wavelength range; the second EL layer includes a third light-emitting layer that emits light having an emission spectrum with a peak in the blue-green to green wavelength range, and a fourth light-emitting layer that emits light having an emission spectrum with a peak in the orange to red wavelength range.

In that case, light emission from the first EL layer is a combination of light emission from both the first light-emitting layer and the second light-emitting layer, and thus exhibits an emission spectrum with peaks both in the blue to blue-green wavelength range and in the yellow to orange wavelength range. That is, the first EL layer emits light of two-wavelength type white or a two-wavelength type color close to white.

Further, light emission from the second EL layer is a combination of light emission from both the third light-emitting layer and the fourth light-emitting layer, and thus exhibits an emission spectrum with peaks both in the blue-green to green wavelength range and in the orange to red wavelength range. That is, the second EL layer emits light of two-wavelength type white or a two-wavelength type color close to white, which is different from the light emitted from the first EL layer.

Thus, a combination of light emitted from the first EL layer and light emitted from the second EL layer can provide emission of white which covers the wavelength ranges of blue to blue-green, blue-green to green, yellow to orange, and orange to red.

Further, the wavelength range of yellow to orange (greater than or equal to 560 nm and less than 580 nm) is a wavelength range of high luminosity; thus, application of an EL layer which includes a light-emitting layer having an emission spectrum peak in the yellow to orange wavelength range is useful. For example, a structure can be used in which a first EL layer which includes a light-emitting layer having an emission spectrum peak in the blue wavelength range, a second EL layer which includes a light-emitting layer having an emission spectrum peak in the yellow wavelength range, and a third EL layer which includes a light-emitting layer having an emission spectrum peak in the red wavelength range are stacked.

Further, two or more EL layers emitting yellow to orange light may be stacked. Two or more EL layers emitting yellow to orange light are stacked, whereby the power efficiency of the light-emitting element can be further improved.

For example, in the case of a light-emitting element in which three EL layers are stacked, a structure can be used in which a second EL layer and a third EL layer each including a light-emitting layer having an emission spectrum peak in the yellow to orange wavelength range are stacked over a first EL layer including a light-emitting layer having an emission spectrum peak in the blue wavelength range (greater than or equal to 400 nm and less than 480 nm). Note that the wavelength of the peak of the emission spectrum from the second EL layer may be the same as or different from that from the third EL layer.

The use of the EL layer emitting light having a spectrum peak in the yellow to orange wavelength range makes it possible to utilize the wavelength range of high luminosity and to improve power efficiency. Thus, the power efficiency of the whole light-emitting element can be increased. Such a structure is advantageous in terms of luminosity and can improve power efficiency in comparison with the case where, for example, an EL layer which emits green light and an EL layer which emits red light are stacked to obtain a light-emitting element which emits yellow to orange light. Further, the emission intensity of light in the blue wavelength range of low luminosity is relatively low in comparison with the case where only one EL layer emitting light having a spectrum peak in the yellow to orange wavelength range of high luminosity is used; thus, the color of emitted light is close to light bulb color (or warm white), and the power efficiency is improved.

In other words, in the above light-emitting element, the color of light which is obtained by combining light whose emission spectrum peak is in the yellow to orange wavelength range and whose wavelength of the peak is greater than or equal to 560 nm and less than 580 nm and light whose emission spectrum peak is in the blue wavelength range (i.e., the color of light emitted from the light-emitting element) can be natural color like warm white or light bulb color. In particular, light bulb color can be easily obtained.

For example, an organometallic complex in which a pyrazine derivative serves as a ligand can be used as the light-emitting substance which emits light having a peak in the yellow to orange wavelength range. Alternatively, the light-emitting layers can be formed by dispersing a light-emitting substance (a guest material) in another substance (a host material). A phosphorescent compound can be used as the light-emitting substance which emits light having a peak in the yellow to orange wavelength range. The power efficiency in the case of using a phosphorescent compound is three to four times as high as that in the case of using a fluorescent compound. The above organometallic complex in which a pyrazine derivative serves as a ligand is a phosphorescent compound, has high emission efficiency, and easily emits light in the yellow to orange wavelength range, and thus is favorable.

For example, a pyrene diamine derivative can be used as the light-emitting substance which emits light having a peak in the blue wavelength range. A fluorescent compound can be used as the light-emitting substance which emits light having a peak in the blue wavelength range. The use of a fluorescent compound makes it possible to obtain a light-emitting element which has longer lifetime than a light-emitting element in which a phosphorescent compound is used. The above pyrene diamine derivative is a fluorescent compound, can obtain an extremely high quantum efficiency, and has long lifetime, and thus is favorable.

Figure 5C:
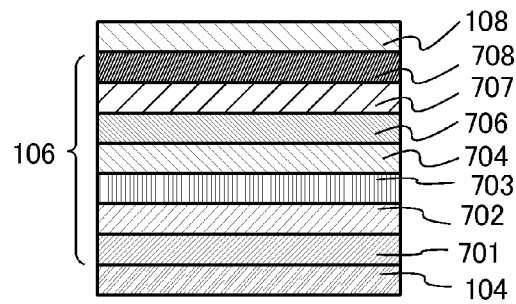

As illustrated in FIG. 5C, the EL layer may include the hole-injection layer 701, the hole-transport layer 702, the light-emitting layer 703, the electron-transport layer 704, an electron-injection buffer layer 706, an electron-relay layer 707, and a composite material layer 708 which is in contact with the second electrode 108, between the first electrode 104 and the second electrode 108.

It is preferable to provide the composite material layer 708 which is in contact with the second electrode 108, in which case damage caused to the EL layer 106 particularly when the second electrode 108 is formed by a sputtering method can be reduced. The composite material layer 708 can be formed using the above-described composite material in which an acceptor substance is mixed with an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

A substance having a high electron-injection property can be used for the electron-injection buffer layer 706: for example, an alkali metal, an alkaline earth metal, a rare earth metal, a compound of the above metal (e.g., an alkali metal compound (e.g., an oxide such as lithium oxide, a halide, or a carbonate such as lithium carbonate or cesium carbonate), an alkaline earth metal compound (e.g., an oxide, a halide, or a carbonate), or a rare earth metal compound (e.g., an oxide, a halide, or a carbonate).

In the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide or the like, a halide, and a carbonate such as lithium carbonate or cesium carbonate), an alkaline earth metal compound (including an oxide, a halide, and a carbonate), and a rare earth metal compound (including an oxide, a halide, and a carbonate). Note that as the substance having a high electron-transport property, a material similar to the material for the electron-transport layer 704 described above can be used.

Further, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other; thus, their functions hardly interfere with each other. Thus, an increase in the driving voltage can be prevented.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably greater than or equal to −5.0 eV, more preferably greater than or equal to −5.0 eV and less than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, in particular, any of the followings is preferably used: CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron-relay layer 707, a metal complex having a metal-oxygen double bond is preferably used. The metal-oxygen double bond has acceptor properties (properties of easily accepting electrons); thus, electrons can be transferred (donated and accepted) more easily. Further, the metal complex which has a metal-oxygen double bond is considered stable. Thus, the use of the metal complex having the metal-oxygen double bond makes it possible to drive the light-emitting element at low voltage more stably.

A phthalocyanine-based material is preferable as the metal complex having a metal-oxygen bond and an aromatic ligand. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that a phthalocyanine-based material having a phenoxy group is preferable as the phthalocyanine-based materials described above. Specifically, a phthalocyanine derivative having a phenoxy group, such as PhO-VOPc, is preferable. The phthalocyanine derivative having a phenoxy group is soluble in a solvent; thus, the phthalocyanine derivative has an advantage of being easily handled during formation of a light-emitting element and an advantage of facilitating maintenance of an apparatus used for deposition.

The electron-relay layer 707 may further contain a donor substance. Examples of the donor substance include organic compounds such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above, a substance having a LUMO level greater than the acceptor level of the acceptor substance contained in the composite material layer 708 can be used as the substance having a high electron-transport property. Specifically, it is preferable to use a substance having a LUMO level of greater than or equal to −5.0 eV, preferably greater than or equal to −5.0 eV and less than or equal to −3.0 eV. Examples of such a substance include a perylene derivative and a nitrogen-containing condensed aromatic compound. Note that a nitrogen-containing condensed aromatic compound is preferably used for forming the electron-relay layer 707 because of its stability.

Specific examples of the perylene derivative include 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), and N,N'-dihexyl-3,4,9,10-perylenetetracarboxylic diimide (Hex PTC).

Specific examples of the nitrogen-containing condensed aromatic compound include pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), and 2,3-bis(4-fluorophenyl)pyrido[2,3-b]pyrazine (abbreviation: F2PYPR).

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracar boxylic diimide (abbreviation: NTCDI-C8F), 3',4'-dibutyl-5,5"bis(dicyanomethylene)-5,5"dihydro-2,2':5',2"terthiophen (abbreviation: DCMT), a methanofullerene (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the light-emitting layer 703, and the electron-transport layer 704 may each be formed using any of the above-described materials.

Then, the second electrode 108 is formed over the EL layer 106.

The second electrode 108 is provided on the side opposite to the side from which light is extracted and is formed using a reflective material. As the reflective material, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on an aluminum alloy film, whereby oxidation of the aluminum alloy film can be prevented. Examples of the material for the metal film or the metal oxide film include titanium and titanium oxide. Further, the above materials are preferable because they are present in large amounts in the Earth's crust and inexpensive to achieve a reduction in manufacturing cost of a light-emitting element.

Note that this embodiment can be combined with any of the other embodiments as appropriate.

Embodiment 3

In this embodiment, application examples of a lighting device will be described.

Figure 6:
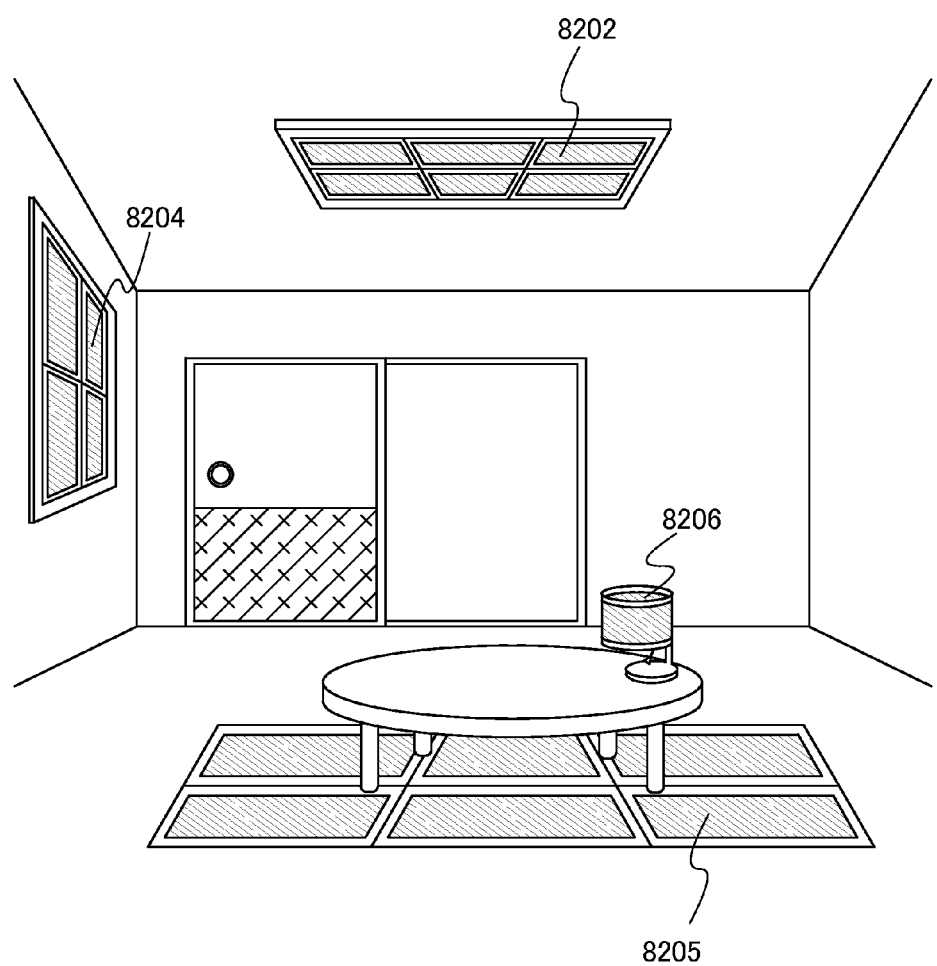
FIG. 6 illustrates examples of application of a lighting device.

FIG. 6 illustrates an example in which a lighting device that is one embodiment of the present invention is used as an indoor lighting device. The lighting device that is one embodiment of the present invention can be used not only as a ceiling-mounted lighting device 8202 but also as a wall-mounted lighting device 8204 and a floor-mounted lighting device 8205. The lighting device can also be used as a desk lamp 8206. Since the lighting device that is one embodiment of the present invention has a planar light source, it has advantages such as a reduction in the number of components such as a light-reflecting plate as compared with the case of using a point light source, and less heat generation as compared with a filament bulb, and is preferably used as an indoor lighting device.

Next, examples in which the lighting device that is one embodiment of the present invention is applied to a lighting device such as a guide light are illustrated in FIGS. 7A to 7D.

Figure 7A:
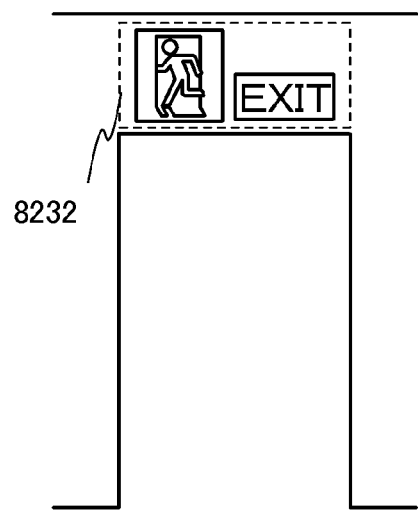
FIGS. 7A to 7D illustrate examples of application of a lighting device.

FIG. 7A illustrates an example in which the lighting device that is one embodiment of the present invention is applied to an emergency exit light.

FIG. 7A illustrates the appearance of an emergency exit light as an example. An emergency exit light 8232 can be formed by a combination of the lighting device and a fluorescent plate provided with a fluorescent portion. Alternatively, the emergency exit light 8232 can be formed by a combination of a lighting device which emits light of a specific color and a light-shielding plate provided with a transmissive portion with a shape illustrated in FIG. 7A. The lighting device that is one embodiment of the present invention can emit light with a constant luminance, and thus is preferably used as an emergency exit light that needs to be on at all times.

Figure 7B:
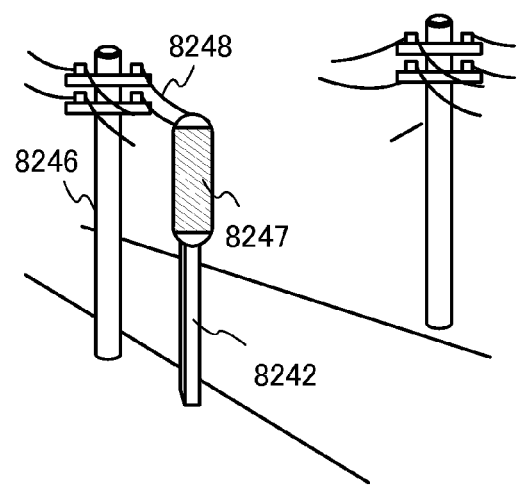

FIG. 7B illustrates an example in which a lighting device 8247 that is one embodiment of the present invention is applied to an outdoor light. An example is illustrated in which the lighting device 8247 is used as an outdoor light, for example, a street lamp. As illustrated in FIG. 7B, the lighting device 8247 is capable of illuminating a large area around it, whereby the visibility of the surrounding area including road can be improved.

In the case where power source voltage is supplied to the lighting device 8247, for example, it can be supplied through a power line 8248 on a utility pole 8246 as illustrated in FIG. 7B. Note that the present invention is not limited to this case; for example, a photoelectric conversion device may be provided in a housing 8242 of the lighting device 8247 so that voltage obtained from the photoelectric conversion device can be used as power source voltage.

Figure 7C:
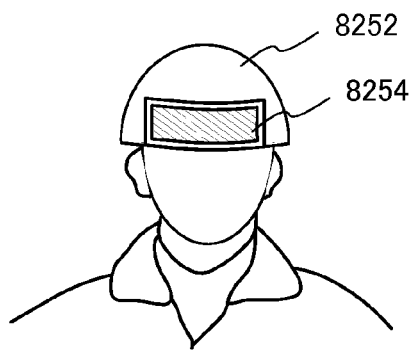
Figure 7D:
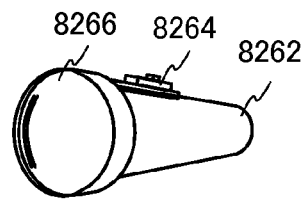

Examples in which the lighting device that is one embodiment of the present invention is applied to a portable light are illustrated in FIGS. 7C and 7D. FIG. 7C illustrates a structure of a wearable light and FIG. 7D illustrates a structure of a handheld light.

The wearable light illustrated in FIG. 7C includes a mounting portion 8252 and a lighting portion 8254 fixed to the mounting portion 8252. The lighting device that is one embodiment of the present invention can be used for the lighting portion 8254. In the wearable light illustrated in FIG. 7C, the lighting portion 8254 can emit light while the mounting portion 8252 is mounted on the head. With the use of a glass housing corresponding to the shape of a portion in the mounting portion 8252, where the lighting portion 8254 is attached (the forehead in FIG. 7C), the lighting portion 8254 can also have a shape with a curved surface which is suitable for the mounting portion 8252. Further, with the use of a plane light source as the lighting portion 8254, the visibility of the surrounding area can be improved.

The handheld light illustrated in FIG. 7D includes a housing 8262, a lighting portion 8266, and a switch 8264. The lighting device that is one embodiment of the present invention can be used for the lighting portion 8266. The use of the lighting device that is one embodiment of the present invention for the lighting portion 8266 reduces the thickness of the lighting portion 8266 and thus reduces the size of the light, which enables the light to be carried around easily.

The switch 8264 has a function of controlling light emission and non-light emission of the lighting portion 8266. In addition, the switch 8264 can have a function of, for example, adjusting the luminance of the lighting portion 8266 in light emission.

In the handheld light illustrated in FIG. 7D, the lighting portion 8266 is turned on with the switch 8264 so as to illuminate the surrounding area, whereby the visibility of the surrounding area can be improved. Furthermore, the lighting device that is one embodiment of the present invention has a plane light source; thus, the number of components such as a light-reflecting plate can be reduced as compared with the case of using a point light source.

The lighting device disclosed in this specification has a structure in which the flexible EL film is put in the glass housing; thus, the EL film can be provided in any form and in any place in the glass housing. Thus, the cylindrical desk lamp 8206 provided with a 360-degree surrounding lighting portion and the lighting device 8247 provided with a 360-degree surrounding lighting portion, which is a street lamp, can be provided. In addition, for example, the lighting portion 8254 and the lighting portion 8266 with a curved surface, and the like can be provided in accordance with the shape of a mounting portion or a housing where the lighting device is mounted or placed.

Moreover, in the lighting device disclosed in this specification, the EL film that is a light-emitting portion is put in the glass housing which is highly effective in blocking contaminants such as moisture, which cause deterioration; thus, the lighting device has high durability. Therefore, the lighting device can also be favorably used outdoors.

It is not necessary to employ a sealing technique (passivation technique) using a large number of materials and a large number of steps for the durability of the EL film itself. This allows the lighting device to be manufactured at low cost, with a simple process, and with high productivity. Thus, an inexpensive lighting device with high reliability can be provided.

Note that what is described in this embodiment with reference to each drawing can be freely combined with or replaced with what is described in any of the other embodiments as appropriate.

This application is based on Japanese Patent Application serial no. 2010-258991 filed with Japan Patent Office on Nov. 19, 2010, the entire contents of which are hereby incorporated by reference.

What is claimed is:

1. A lighting device comprising:
   a first light-emitting panel;
   a second light-emitting panel; and
   a glass housing having a curved surface;
   wherein the first light-emitting panel comprises a first light-emitting element provided over a first flexible substrate,
   wherein the first light-emitting element comprises a first EL layer interposed between a first electrode and a second electrode;
   wherein the second light-emitting panel comprises a second light-emitting element provided over a second flexible substrate,
   wherein the second light-emitting element comprises a second EL layer interposed between a third electrode and a fourth electrode,
   wherein the glass housing is provided with a first terminal electrode, a second terminal electrode, a third terminal electrode, and a fourth terminal electrode,
   wherein the first light-emitting panel and the second light-emitting panel are provided in the glass housing,
   wherein the first electrode and the first terminal electrode are electrically connected to each other,
   wherein the second electrode and the second terminal electrode are electrically connected to each other,
   wherein the third electrode and the third terminal electrode are electrically connected to each other,
   wherein the fourth electrode and the fourth terminal electrode are electrically connected to each other,
   wherein a shape of the first light-emitting panel and a shape of the second light-emitting panel are different from each other,
   wherein the first light-emitting panel is covered with a first insulating film, and
   wherein the second light-emitting panel is covered with a second insulating film.

2. The lighting device according to claim 1, wherein a color of light emitted from the first light-emitting panel and a color of light emitted from the second light-emitting panel are different from each other.

3. The lighting device according to claim 1, wherein a light emission surface of the first light-emitting panel is provided along the curved surface.

4. The lighting device according to claim 1, wherein the glass housing is cylindrical, and wherein the first light-emitting panel is rolled in a form of a cylinder to be put in the glass housing.

5. The lighting device according to claim 1, wherein an organic resin layer with the curved surface is provided on the glass housing on a light emission surface side of the first light-emitting panel.

6. The lighting device according to claim 1, wherein the flexible substrate comprises an organic resin film.

7. The lighting device according to claim 1, wherein the flexible substrate comprises a metal film.

8. The lighting device according to claim 1, wherein the first light-emitting panel and the glass housing are fixed to each other with a bonding layer.

9. The lighting device according to claim 1, wherein the first light-emitting element further comprises a third EL layer overlapping with the first EL layer with an intermediate layer interposed between the first EL layer and the third EL layer.

10. The lighting device according to claim 1, wherein the first light-emitting element and the second light-emitting element are separate from each other.

* * * * *